US009972379B2

(12) United States Patent
Lesartre

(10) Patent No.: US 9,972,379 B2
(45) Date of Patent: May 15, 2018

(54) FIRST DATA IN RESPONSE TO SECOND READ REQUEST

(71) Applicant: HEWLETT-PACKARD DEVELOPMENT COMPANY, L.P., Houston, TX (US)

(72) Inventor: Gregg B. Lesartre, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 14/897,385

(22) PCT Filed: Jul. 26, 2013

(86) PCT No.: PCT/US2013/052240
§ 371 (c)(1),
(2) Date: Dec. 10, 2015

(87) PCT Pub. No.: WO2015/012858
PCT Pub. Date: Jan. 29, 2015

(65) Prior Publication Data
US 2016/0148673 A1    May 26, 2016

(51) Int. Cl.
| G11C 11/4096 | (2006.01) |
| G11C 7/10 | (2006.01) |
| G11C 11/4076 | (2006.01) |
| G11C 14/00 | (2006.01) |
| G11C 16/26 | (2006.01) |
| G11C 16/32 | (2006.01) |

(52) U.S. Cl.
CPC ......... *G11C 11/4096* (2013.01); *G11C 7/10* (2013.01); *G11C 11/4076* (2013.01); *G11C 14/0018* (2013.01); *G11C 16/26* (2013.01); *G11C 16/32* (2013.01)

(58) Field of Classification Search
CPC ... G11C 11/4096; G11C 11/4076; G11C 7/10; G11C 16/26; G11C 16/37
USPC ...................................................... 365/189.2
See application file for complete search history.

(56) References Cited

U.S. PATENT DOCUMENTS

| 5,301,278 A | 4/1994 | Bowater et al. |
| 6,173,344 B1 | 1/2001 | Mohammed et al. |

(Continued)

FOREIGN PATENT DOCUMENTS

| CN | 101131681 | 2/2008 |
| CN | 102736989 | 10/2012 |

(Continued)

OTHER PUBLICATIONS

Caulfield, et al.; "Understanding the Impact of Emerging Non-volatile Memories on High-performance, IO-intensive Computing," Nov. 2010 (11 pages).

(Continued)

*Primary Examiner* — Alexander Sofocleous
*Assistant Examiner* — Alfredo Bermudez Lozada
(74) *Attorney, Agent, or Firm* — Hewlett Packard Enterprise Patent Department

(57) ABSTRACT

First and second read requests are received. First data is fetched in response to the first read request. The fetched first data is then stored. The fetched first data corresponds to an address of the first read request. The fetched first data is returned in response to the second read request.

12 Claims, 4 Drawing Sheets

(56) References Cited

U.S. PATENT DOCUMENTS

| | | |
|---|---|---|
| 6,957,308 B1 | 10/2005 | Patel |
| 7,245,147 B1 | 7/2007 | Nouban et al. |
| 7,571,296 B2 | 8/2009 | Reed |
| 2004/0148470 A1* | 7/2004 | Schulz ................ G06F 12/0862 711/137 |
| 2008/0133820 A1 | 6/2008 | Ganesan et al. |
| 2008/0162799 A1 | 7/2008 | Spry et al. |
| 2008/0183957 A1 | 7/2008 | Dreps et al. |
| 2008/0244135 A1 | 10/2008 | Akesson et al. |
| 2012/0155160 A1 | 6/2012 | Alam et al. |
| 2012/0166891 A1 | 6/2012 | Dahlen et al. |
| 2012/0317364 A1 | 12/2012 | Loh |
| 2013/0103904 A1 | 4/2013 | Pangborn et al. |
| 2014/0013187 A1* | 1/2014 | Blaunstein .......... G06F 13/1689 714/773 |

FOREIGN PATENT DOCUMENTS

| | | |
|---|---|---|
| TW | I307464 B | 3/2009 |
| TW | I397081 B | 5/2013 |
| WO | WO-2013048493 | 4/2013 |

OTHER PUBLICATIONS

International Searching Authority, The International Search Report and the Written Opinion for PCT/US2013/052240, dated Apr. 21, 2014, 10 Pages.

* cited by examiner

FIRST DATA IN RESPONSE TO SECOND READ REQUEST

BACKGROUND

A computer system may include both volatile and non-volatile storage devices. Due to their relatively faster access times, volatile memory devices, such as dynamic random access memory (DRAM) devices, may be used to form the working memory for the computer system. To preserve computer system data when the system is powered off, data may be stored in non-volatile mass storage devices associated with slower access times, such as magnetic media-based or optical media-based mass storage devices. Recent developments in non-volatile memory technology are leading non-volatile memory devices to become increasingly used for both traditional "memory" and "storage" functions.

BRIEF DESCRIPTION OF THE DRAWINGS

The following detailed description references the drawings, wherein.

DETAILED DESCRIPTION

Figure 1:
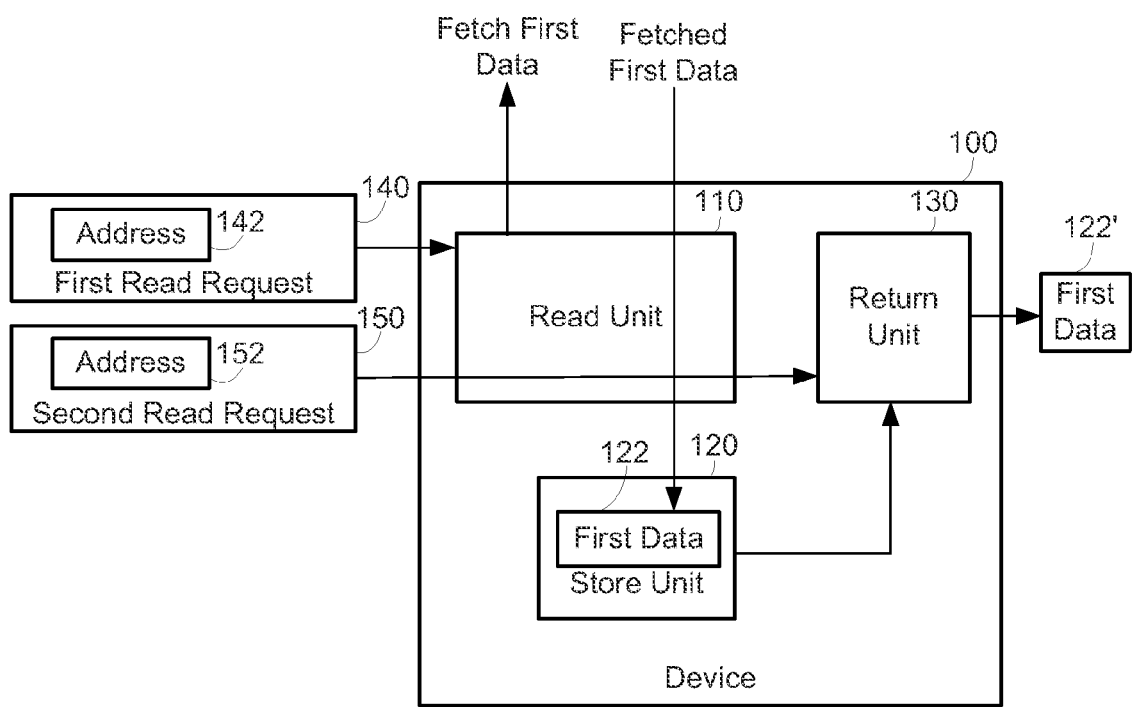
FIG. 1 is an example block diagram of a device to return first data in response to a second read request.

Specific details are given in the following description to provide an understanding of examples of the present techniques. However, it will be understood that examples of the present techniques may be practiced without these specific details. For example, systems may be shown in block diagrams in order not to obscure examples of the present techniques in unnecessary detail. In other instances, well-known processes, structures and techniques may be shown without unnecessary detail in order to avoid obscuring the examples of the present techniques.

Some non-volatile memory devices, such as non-volatile memory devices from emerging technologies (flash-based random access memory (RAM), phase change memory and memristor technologies, as examples) may have access times that are significantly slower than the access times of traditional volatile memory devices, such as dynamic random access memory (DRAM) devices. Due to the access time differences, it may be challenging to communicate with mixed memory technology devices (such as non-volatile and volatile memory devices) that are coupled to the same memory bus.

In this manner, incorporating non-volatile and volatile memory devices on the same memory bus may be challenging because the timing specifications of the memory bus may be deterministic in nature, in that commands that are communicated via the memory bus to memory devices are expected to be completed in order and within certain times. Meeting these specifications may be particularly challenging when the memory devices have significantly disparate timing properties.

For example, modern computer systems may utilize DRAM Dual in-line memory modules (DIMMs) for system memory. Developed to provide a standard interface to these DRAM DIMMs, the Double data rate (DDR) memory interface has evolved to expect typical DRAM characteristics. For example, the DDR memory interface has evolved to expect the memory of the DIMM to provide requested read data after a fixed amount of time for all read accesses to the memory. While this proven has successful DRAM, the fixed time may limit opportunities to mix memories with different memory access latencies using the same DDR interface, including more complex hierarchical DIMM architectures that might otherwise be able to boost overall performance with advanced features, such as integrated caching. For example, a DIMM including a nonvolatile memory and DDR interface may be incapable of responding to a read request within the fixed time limit.

Examples of present techniques may allow a memory having a longer latency to be used on a memory bus based design for shorter latency memory. An example device may include a read unit, a store unit and a return unit. The read unit may fetch first data in response to a first read request. The store unit may store the fetched first data. The return unit may return the fetched first data in response to a second read request. The fetched first data may correspond to an address of the first read request.

Hence, examples of present techniques may new memory technologies, and architectures with longer accesses to share a DDR interface with standard DIMMs to provide direct access to higher capacities of memory without providing additional memory interfaces. By allowing the DDR interface to support new memories of mixed latencies, examples may enable higher capacities, non-volatility, and lower cost DIMM alternatives to coexist with conventional DDR compliant DIMMs. With this arrangement, faster standard DIMMs may deliver data with their shorter latency while sharing the DDR interface with slower high capacity DIMMs.

Referring now to the drawings, FIG. 1 is an example block diagram of a device 100 to boot from a modified factory image. The device 100 may couple to or be included in any type of computing device including a factory image, such as a notebook computer, a desktop computer, an all-in-one system, a server, a network device, a wireless device, a storage device, a mobile device and the like.

In the example of FIG. 1, FIG. 1 is an example block diagram of a device 100 to return first data in response to a second read request. The device 100 may couple to or be included in any type of computing device to access memory, such as a notebook computer, a desktop computer, an all-in-one system, a server, a network device, a wireless device, a storage device, a mobile device and the like.

The device 100 includes a read unit 110, a store unit 120 and a return unit 130. The read, store and return units 110, 120 and 130 may include, for example, a hardware device including electronic circuitry for implementing the functionality described below, such as control logic and/or memory. In addition or as an alternative, the read, store and return units 110, 120 and 130 may be implemented as a series of instructions encoded on a machine-readable storage medium and executable by a processor.

The read unit 110 may receive a first read request 140 and fetch first data in response to a first read request 140. A read request may be any type of message or request seeking to read the data located at an address of a memory. The first data may be fetched from a memory (not shown) that is either part of the device or interfaces with the device. For example, the device 100 may be a Dual in-line memory module (DIMM). The device 100 may interface with a mix of both long and/or short latency memories. Alternatively or additionally, there may be a plurality of DIMMs containing long and/or short latency memories connected to the single memory bus. Each of the DIMMs may contain one of the long and/or short latency types of memory.

Examples of the short latency memory may include volatile memory such as dynamic random-access memory (DRAM) and static random-access memory (SRAM). Examples of the long latency memory may include memory with a hierarchical structure, phase change or memristor modules and nonvolatile memory, such as random-access memory (NVRAM) like flash memory. Further, the device 100 may receive the first read request 140 as well as a second read request 150 via a memory bus (not shown). For example, the memory bus may be any type of Double data rate (DDR) bus, such as a DDR3 or DDR4 bus. For example, a single DDR bus may be connected to mix of Flash and DRAM DIMMs having DDR interfaces. The DDR bus may part be of or connected to a system bus that interfaces with components of a system or other device, such as a processor, main memory, Input/Output component, network card, and the like.

The store unit 122 may store the first data 122 fetched from memory in response to the first read request 140. The store unit 120 may include a cache (not shown) to store data fetched from the memory. Data available from the cache may have a lower latency than data that must first be accessed by from the memory.

As the memory may be a long latency memory, the device 100 may receive the second read request 150 before the device 100 is able to return the fetched first data 122 that corresponds to the first read request 140. As a result, the return unit 130 may return the fetched first data 122' in response to the second read request 150, instead of the first read request 140. Therefore, the fetched first data 122 may correspond to an address 142 of the first read request. Further, the fetched first data 122 may not correspond to an address 152 of the second read request 152.

While FIG. 1 describes the fetched first data 122 being returned in response to the second read request 150, examples may also include the fetched first data 122 being returned in response to a subsequent read request, such as a third or fourth read request. For example, if the first data 122 has not yet been fetched after the second read request 150 is received but has been fetched by a time the third request is received, the fetched first data 122 may be returned in response to the third read request. The first and second read requests 140 and 150 may be sent by a memory controller (not shown), as explained in greater detail below with respect to FIG. 2. The first and second read requests 140 and 150 may be separate requests having separate addresses 142 and 152. Examples may include other read requests being sent between the first and second read requests 140 and 150.

Figure 2:
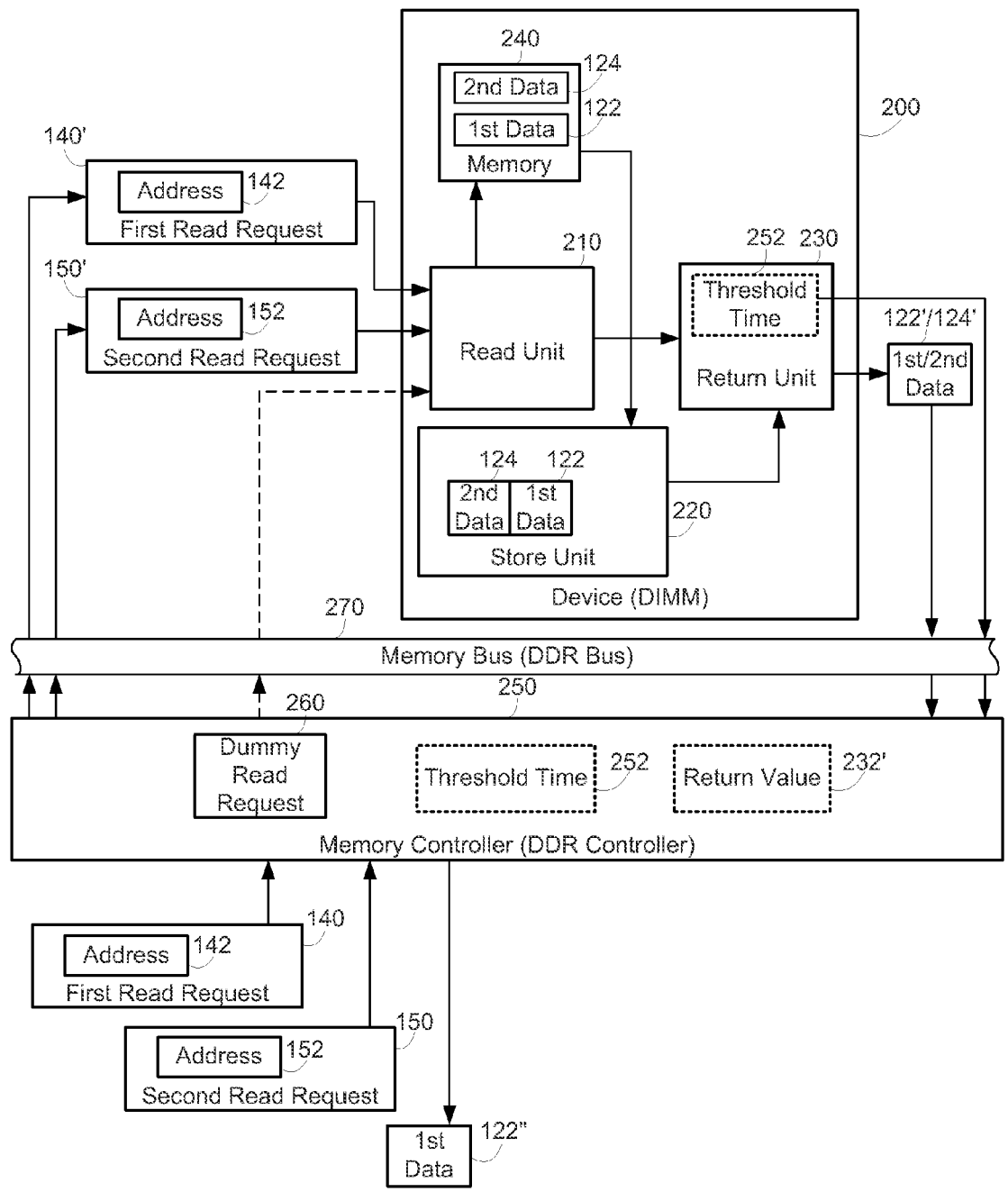
FIG. 2 is an example block diagram of a controller to send requests and a device to return data.

FIG. 2 is an example block diagram of a controller 250 to send requests and a device 200 to return data. The device 200 may couple to or be included in any type of computing device to access memory, such as a notebook computer, a desktop computer, an all-in-one system, a server, a network device, a wireless device, a storage device, a mobile device and the like.

The device 200 of FIG. 2 may include at least the functionality and/or hardware of the device 100 of FIG. 1. For example, the device 200 includes a read unit 210 that includes the functionality and/or hardware of the read unit 110 of FIG. 1, a store unit 220 that includes the functionality and/or hardware of the store unit 120 of FIG. 1 and a return unit 230 that includes the functionality and/or hardware of the return unit 130 of FIG. 1. The device 200 further includes a memory 240. As mentioned above the memory 240 may include only long latency memory, such as only nonvolatile memory, or a combination of long and short latency memory, such as both volatile and nonvolatile memory. Long latency memories are not limited to nonvolatile memories. For example, long latency memories may include slow volatile memories. While the memory 240 is shown to be internal to the device 200, examples may also include the memory 240 being external to the device 200.

The device 200 and the memory controller are shown to interface via a memory bus 270, such as a DDR bus. The memory controller 250 may be any type of type of device to receive read requests, such as a memory controller like a DDR controller. The controller 250 may include, for example, a hardware device including electronic circuitry for implementing the functionality described below, such as control logic and/or memory. In addition or as an alternative, the controller 250 may be implemented as a series of instructions encoded on a machine-readable storage medium and executable by a processor.

The memory controller 250 may interface with or be a part of a processor (not shown), such as a central processor unit (CPU). The processor may send requests, such as the first and second read requests 140 and 150, to the memory controller 250. For such purposes as storing data in and retrieving data from the memory 240, activating memory cell rows (not shown) of the memory 240 and so forth, the memory controller 250 may selectively assert and deassert control, address and data signals on the memory bus 270 to generate corresponding bus cycles, or operations, on the memory bus 270.

The memory 240 may include non-volatile memory (not shown) having a suitable memory interface to the read unit 210 and store unit 220, such as DDR, LPDDR, ONFI, or a non-standard memory interface, as explained above. In addition, other types of memories (not shown), such as volatile memory like DRAM or SRAM, may interface with or be included within device 200 or be included in other devices that connect to the memory bus 270. For example, a plurality of devices 200 or DIMMs having nonvolatile and/or volatile memories may be connected to the single memory bus 270.

Assuming the memory 240 includes the nonvolatile memory, memory cells of the nonvolatile memory may, in general, have an associated slower access time, as compared to the time to access memory cells of a volatile memory. As a result, the nonvolatile memory may experience longer latency in storing data in and/or retrieving data from its memory cells. The memory bus 270, may be governed by a set of minimum timing specifications that are specifically tailored for the relatively faster access times of volatile memory. Moreover, the memory bus 270 may be a deterministically-timed bus, which is governed by a specification that does not provide a delay command or other explicit mechanisms to the introduction of a delay for purposes of accommodating a relatively slower memory device, such as the device 200 that includes memory 240 having nonvolatile memory.

For example, the memory bus 270 may be a DDR DRAM or SDRAM memory bus, which has a deterministic interface that allows no provisioning for the delaying of a command. In general, the specification for the DDR DRAM or SDRAM memory bus prescribes that all commands are completed in order and with prescribed time(s).

The device 200 may include a bus interface (not shown) that is coupled to the memory bus 270 for purposes of decoding signals from the memory bus 270 and furnishing encoded signals to the memory bus 270 to communicate data to and from the memory 240. Thus, via this mechanism, the memory 240 may, for example, receive various commands, such as commands to write data, read data, activate a given row, and so forth from the memory controller 250. Due to its relatively slow access time, however, the memory 240 may be incapable of keeping up with the rate at which commands are communicated over the memory bus 270. To accommodate the timing disparity, the device 200 may send requested data in response to a future read request, instead of a current read request, as explained above in FIG. 1.

As shown in FIG. 2, the memory controller 250 may send or forward the first and second read requests 140 and 150 to the device 200. However, if the memory controller 250 receives the first data 122 in response to the second read request 150, the memory controller 250 still outputs the fetched first data 122 back, such as to the processor, as a response to the first read request 140 (and not the second read request 150).

The read unit 210 may fetch second data 124 in response to the second read request 150. The store unit 220 may store the fetched second data 124. The return unit 230 may return the fetched second data 124 in response to a third read request (not shown). Similar operations may be carried for subsequent read requests.

The read unit 210 may receive a plurality of read requests according to a sequence from the memory controller 250. The return unit 230 may return data corresponding to the plurality of read requests according to the same sequence. In one example, the return unit 230 and/or store unit 220 may include a First In, First Out (FIFO) structure (not shown) to ensure that data is returned in the same sequence. For example, the memory controller 250 may send first through fifth read requests. The data corresponding to the first through fifth requests may not be retrieved in order from the memory 240. Nonetheless, the corresponding data may be output by the return unit 230 according to the same sequence in which the first through fifth read requests were received by the read unit 210.

Further, the memory controller 250 may output the plurality of read requests to the read unit 210 independently of when the data is returned by the return unit 230. For instance, the memory controller 250 may send all of the first through fifth read requests to the read unit 210 regardless of if or when the return unit 230 returns any of the data corresponding to the first through fifth read requests.

The memory controller 250 may send a dummy read request 260 to the read unit 210 after a last read request of the plurality of read requests is sent to the read unit 210. The return unit 230 may return fetched last data stored in the store unit 220 in response to the dummy read request 260. For example, assume the memory controller 250 sends 10 read requests to the device 200 and there is a delay of 1 read request by the device in sending back data. That is, the device 200 may send the first data 122 in response to the second read request 150, the second data 124 in response to a third read request, and so on. Then, after the 10th read request is sent by the memory controller 250 to the device 200, only the data corresponding to the 9th read request will be returned. However, the read unit 210 may still retrieve the data corresponding to the 10th read request and store it at the store unit 220, in response to the 10th read request. Thus, the memory controller 250 may send the dummy read request 260 after the 10th read request, in order to have the return unit 230 send the data corresponding to the 10th read request. The dummy read request 260 may be issued as an access to an invalid address, or as an alternately encoded transaction such that the read unit 210 recognizes it as an invalid request and therefore does not fetch any data into the store unit 220 as a result of the dummy read request 260.

For similar reasons, the memory controller 250 may also send the dummy read request 260 if there is only one read request to be forwarded to the device 200. For example, assume the first read request 140 is sent to the read unit 210 but that there is no second read request 150 to send to the read unit 210. In this case, if the dummy read request 260 is sent after the first read request 140, the return unit 230 may return the fetched first data 122 to the memory controller 250.

The return unit 230 may return an empty or null value in response to the dummy read request 260, if there is no data to be returned by the store unit 220. In one example, the return unit 230 may also return an empty or null value if the data has not been fetched within an expected time frame. For example, the return unit 230 may return the empty value if the first data 122 has not been returned by the expected time after the first read request 140 is received as well as if the first data 122 has still not been returned by the expected time after the second read request 150 is received, and so on. The memory controller 250 may use the empty or null values to track which of the data has not yet been received. An empty or null value may be encoded into a response to the read request, for instance, by returning a specific value provided in the data and/or error correction code (ECG) fields that would normally indicate a data error.

In one example, the memory controller 250 may delay sending the second read request 150 to the device 200 by at least a threshold time 252 after the first read request 140 is sent to the device 200. For example, if the threshold time 252 is 50 nanoseconds, the memory controller 250 may wait at least 50 nanoseconds between sending the first read request 140 and second read request 150 to the device 200. Generally, the memory controller 250 may also wait at least the threshold time 252 between sending any consecutive requests. This may increase the likelihood that data may returned from the device 200 within a closer time window of the related read request that was sent previously.

For example, if the memory controller 250 does not wait the threshold time 252, the first data 122 of the first read request 140 may not be received by the memory controller 250 until after a fourth read request is sent to the device 200. However, if the memory controller 250 waits the threshold time 252, the first data 122 of the first read request 140 may be received by the memory controller 250 after the second read request 150 is sent to the device 200.

In one example, the threshold time 252 may also vary dynamically based on the estimated latency of the read request. For instance, the return unit 230 may further send the threshold time 252 to the memory controller 250 in response to the first read request 140. This threshold time 252 sent by the device 200 may be based on a time to retrieve the first data 122. The threshold time 252 may be based on a hierarchy of the memory 240, a type of cell of the memory 240 from which the data is read (such as volatile or nonvolatile memory), a location of the data (such as the cache or the memory 240 of the device 200) and the like. Unlike conventional memory controllers, examples of the memory controller 250 may include additional functionality to read data from memories of mixed latencies, even when communicating via a conventional memory bus, such as a DDR memory bus.

Figure 3:
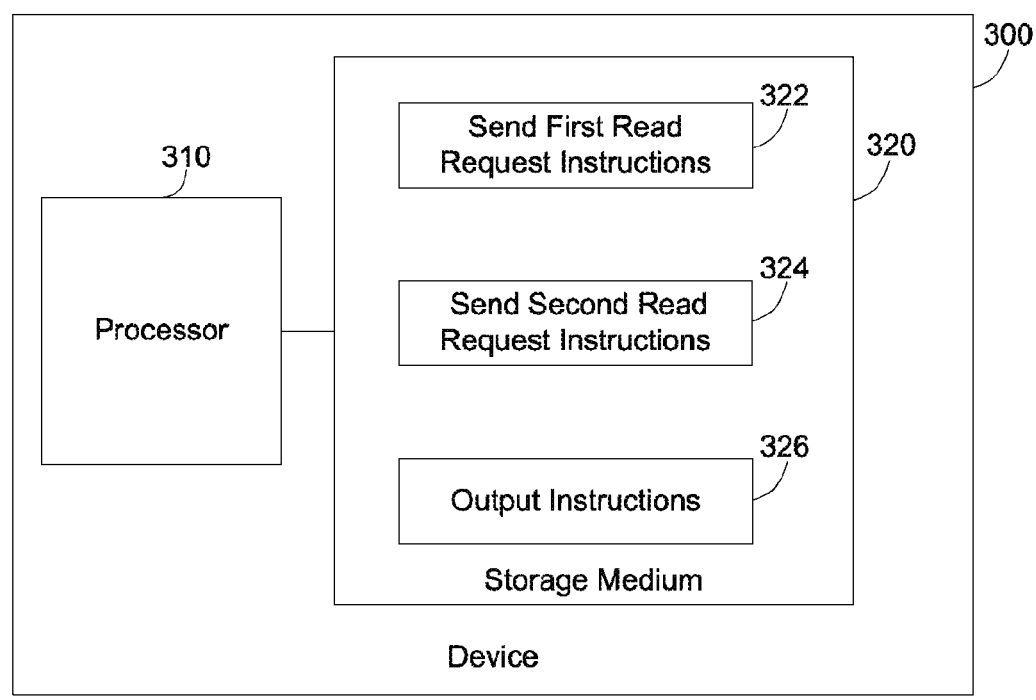
FIG. 3 is an example block diagram of a computing device including instructions for receiving first data from a MAIM in response to a second read request.

FIG. 3 is an example block diagram of a computing device 300 including instructions for receiving first data from a DIMM in response to a second read request. In FIG.

3, the computing device 300 includes a processor 410 and a machine-readable storage medium 320. The machine-readable storage medium 320 further includes instructions 322, 324, 326 and 328 for outputting first data in response to a second read request.

The computing device 300 may be, for example, a controller, a secure microprocessor, a notebook computer, a desktop computer, an all-in-one system, a server, a network device, a wireless device, or any other type of user device capable of executing the instructions 322, 324, 326 and 328. In certain examples, the computing device 300 may include or be connected to additional components such as memories, sensors, displays, etc.

The processor 310 may be, at least one central processing unit (CPU), at least one semiconductor-based microprocessor, other hardware devices suitable for retrieval and execution of instructions stored in the machine-readable storage medium 320, or combinations thereof. The processor 310 may fetch, decode, and execute instructions 322, 324, 326 and 328 to implement outputting the first data in response to the second read request. As an alternative or in addition to retrieving and executing instructions, the processor 310 may include at least one integrated circuit (IC), other control logic, other electronic circuits, or combinations thereof that include a number of electronic components for performing the functionality of instructions 322, 324, 326 and 328.

The machine-readable storage medium 320 may be any electronic, magnetic, optical, or other physical storage device that contains or stores executable instructions. Thus, the machine-readable storage medium 320 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 320 can be non-transitory. As described in detail below, machine-readable storage medium 320 may be encoded with a series of executable instructions for outputting the first data in response to the second read request.

Figure 4:
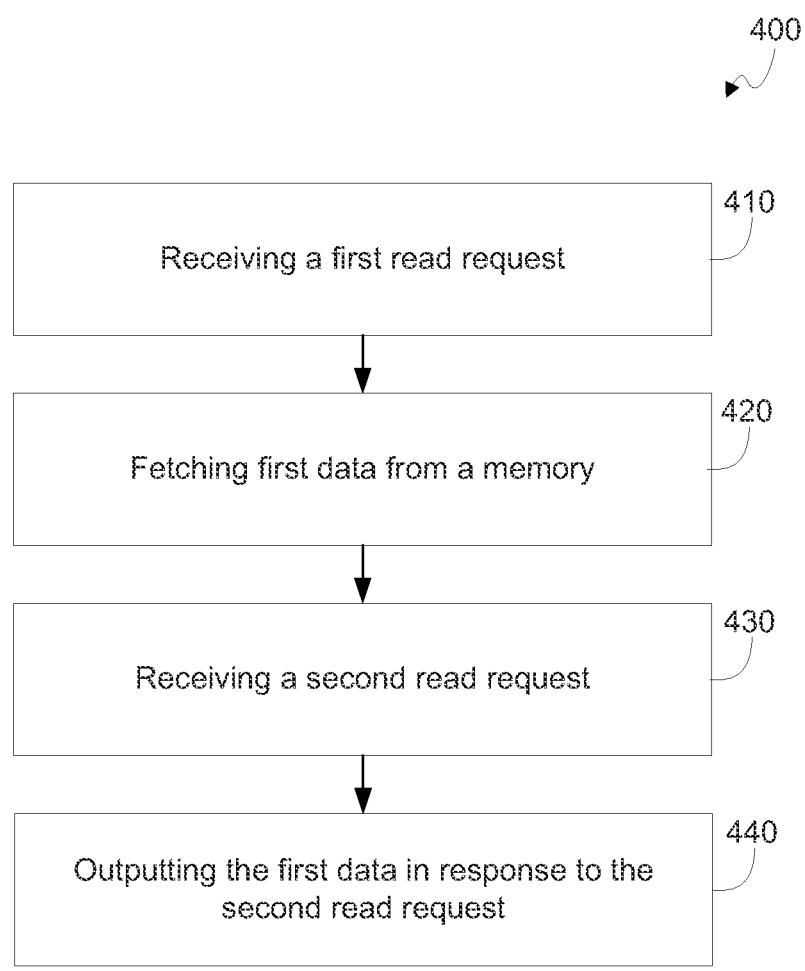
FIG. 4 is an example flowchart of a method for outputting first data to a client in response to a second read request.

Moreover, the instructions 322, 324, 326 and 328 when executed by a processor (e.g., via one processing element or multiple processing elements of the processor) can cause the processor to perform processes, such as, the process of FIG. 4. For example, the send first read request instructions 322 may be executed by the processor 310 send a first read request (not shown) to a Dual in-line memory module (DIMM) (not shown) in response to receiving the first read request from a client (not shown).

The send second read instructions 324 may be executed by the processor 310 to send a second read request to the DIMM in response to receiving the second read request from the client. The output instructions 326 may be executed by the processor 310 to output first data to the client in response to the first read request. The first data may be received from the DIMM in response to the second read request.

FIG. 4 is an example flowchart of a method 400 for outputting first data to a client in response to a second read request. Although execution of the method 400 is described below with reference to the device 100, other suitable components for execution of the method 400 can be utilized, such as the device 200. Additionally, the components for executing the method 400 may be spread among multiple devices (e.g., a processing device in communication with input and output devices). In certain scenarios, multiple devices acting in coordination can be considered a single device to perform the method 400. The method 400 may be implemented in the form of executable instructions stored on a machine-readable storage medium, such as storage medium 320, and/or in the form of electronic circuitry.

At block 410, the device 100 receives a first read request 140. Then, at block 420, the device 100 fetches first data 122 from a memory. Next, at block 430, the device 100 receives a second read request 150. The first and second read requests are received via a Dual in-line memory module (DIMM) interface. Lastly, at block 440, the device 100 outputs the first data 122' in response to the second read request 150. The first data 122' does not correspond to an address 152 of the second read request 150. Second data is fetched from the memory in response to the second read request 150. The second data is output in response to a third read request.

According to the foregoing, examples of present techniques provide a method and/or device that allow memories with longer accesses to share a DDR interface with standard DIMMs to provide direct access to higher capacities of memory without providing additional memory interfaces. With this arrangement, faster standard DIMMs may deliver data with their shorter latency while sharing the DDR interface with slower high capacity DIMMs.

I claim:

1. A device, comprising:
 a read unit to fetch first data in response to a first read request;
 a store unit to store the fetched first data; and
 a return unit to:
  send a threshold time for a second read request in response to the first read request; and
  return the fetched first data in response to the second read request, wherein
 the fetched first data corresponds to a first address of the first read request; wherein:
 the threshold time is based on an estimated latency of the first read request;
 the read unit is to fetch second date corresponding to a second address of the second read request in response to the second read request; and
 the store unit is store the fetched second data.

2. The device of claim 1, further comprising:
 a memory controller of a processor to send the first and second read requests to the read unit, wherein
 the memory controller is to output the fetched first date in response to the first read request.

3. The device of claim 2, wherein,
 the memory controller is to send a dummy read request to the read unit after a last read request of a plurality of read requests is sent to the read unit, and
 the return unit is to return fetched last data stored in the store unit in response to the dummy read request.

4. The device of claim 2, wherein,
 the memory controller is to send the second read request as a dummy read request, and
 the return unit is to return the fetched first data in response to the dummy read request.

5. The device of claim 4, wherein the return unit is to return an empty value in response to at least one of the dummy and first read request, if there is no data to be returned by the store unit.

6. The device of claim 2, wherein the memory controller is to delay sending the second read request to the device by at least the threshold time after the first read request is sent to the device.

7. The device of claim 1, wherein,
 the read unit is to receive a plurality of read requests according to a sequence, and
 the return unit is to return data corresponding to the plurality of read requests according to the same sequence.

8. The device of claim 7, wherein a memory controller is to output the plurality of read requests to the read unit independently of when the data is returned by the return unit.

9. The device of claim 1, wherein,
the return unit is to return the fetched second data in response to a third read request.

10. The device of claim 2, wherein,
the device includes one or more Dual in-line memory modules (DIMMs), and
the memory controller is a Double data rate (DDR) controller, and
the data is fetched from at least one of a volatile memory (VM) and a non-volatile memory (NVM) of the one or more DIMMs.

11. A method, comprising:
receiving a first read request;
fetching first data from a memory;
outputting a threshold time for a second read request in response to the first read request, the threshold time based on an estimated latency of the first read request;
receiving a second read request; and
outputting the first data in response to the second read request, wherein
the first data does not correspond to an address of the second read request, and
the first and second read requests are received via a Dual in-line memory module (DIMM) interface.

12. The method of claim 11, wherein second data is fetched from the memory in response to the second read request and the second data is output in response to a third read request.

* * * * *